United States Patent [19]

Takahashi et al.

[11] Patent Number: 4,893,168

[45] Date of Patent: Jan. 9, 1990

[54] SEMICONDUCTOR INTEGRATED CIRCUIT DEVICE INCLUDING BONDING PADS AND FABRICATING METHOD THEREOF

[75] Inventors: Yoshikazu Takahashi, Shiga; Tsuneo Itoh, Kokubunji; Makoto Takechi, Kodaira, all of Japan

[73] Assignees: Hitachi, Ltd.; Hitachi Microcomputer Engineering, Ltd., Tokyo, Japan

[21] Appl. No.: 384,680

[22] Filed: Jun. 2, 1982

[30] Foreign Application Priority Data

Jun. 22, 1981 [JP] Japan .................................. 56-95357

[51] Int. Cl.⁴ ...................... H01L 27/02; H01L 21/44
[52] U.S. Cl. ........................................ 357/68; 357/71;
357/65; 357/69; 357/42; 437/48; 437/50;
437/51; 437/206; 437/209
[58] Field of Search ...................... 29/577 C, 591, 589;
357/42, 45, 51, 71, 65, 68, 69; 307/475; 437/48,
50, 51, 206, 209

[56] References Cited

U.S. PATENT DOCUMENTS

| | | | |
|---|---|---|---|
| 3,771,217 | 11/1973 | Hartman | 29/577 C X |
| 3,936,812 | 2/1976 | Cox et al. | 364/716 X |
| 4,060,828 | 11/1977 | Satonaka | 357/40 X |
| 4,161,662 | 7/1979 | Malcolm et al. | 357/71 |
| 4,249,193 | 2/1981 | Balyoz et al. | 357/45 X |
| 4,388,755 | 6/1983 | Enomoto et al. | 29/577 C |
| 4,412,237 | 10/1983 | Matsumura et al. | 357/41 X |

FOREIGN PATENT DOCUMENTS

| | | | |
|---|---|---|---|
| 0023118 | 1/1981 | European Pat. Off. | 307/475 |
| 0019639 | 2/1981 | Japan | 29/591 |

OTHER PUBLICATIONS

Donze, R. L. et al., "Circuit Layout Technique for Custom LSI Components", in *IBM Technical Disclosure Bulletin*, vol. 22, No. 5, 10-1979, pp. 2018-2020.

*Primary Examiner*—Brian E. Hearn
*Assistant Examiner*—T. N. Quach
*Attorney, Agent, or Firm*—Antonelli, Terry & Wands

[57] ABSTRACT

Herein disclosed is a semiconductor integrated circuit device which includes a unit cell for forming such an input/output circuit portion as is made capable of selecting any of a plurality of different input and output functions by changing a wiring pattern. The semiconductor integrated circuit is constructed such that there are formed in a manner to correspond to the unit cell a plurality of bonding pad regions which can be separated from one another so that any of the plural input and output functions can be arbitrarily selected through those bonding pad regions.

24 Claims, 9 Drawing Sheets

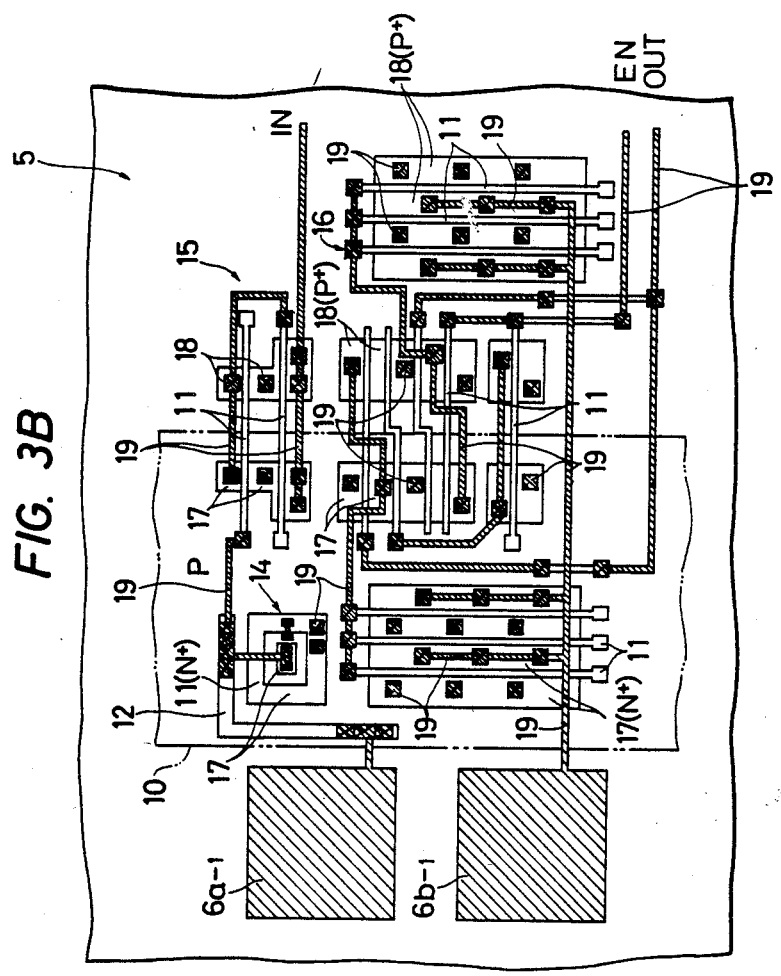

SEMICONDUCTOR INTEGRATED CIRCUIT DEVICE INCLUDING BONDING PADS AND FABRICATING METHOD THEREOF

BACKGROUND OF THE INVENTION

The present invention relates to a semiconductor integrated circuit device (which will be referred to as an "IC") which includes a unit cell forming an input/output circuit portion capable of selecting any of a plurality of different input and output functions by changing a wiring pattern, and to a method of fabricating the same. More particularly, the present invention relates to a logic IC resorting to a master slice approach.

For example, a logic IC for a computer adopts the so-called "master slice approach" as its design because it is necessary to design a few, but multiple, kinds of ICs within a short time period. The IC resorting to the master slice approach has an advantage that it can realize a multiplicity of logic functions by providing various wiring patterns for the master, without changing the basic design (i.e., the master). In order to enjoy this advantage, it is necessary that the functions of respective pins (or leads) can be arbitrarily selected or changed so as to satisfy the various requirements. Specifically, it is required that the respective pins can be set so that in the master slice any one function can be arbitrarily selected from the respective functions of an input, an output and bidirectionally of the input and output.

In order to satisfy this requirement, according to the prior art, there is adopted means for providing one I/$\overline{O}$ cell for each of the bonding pads which are provided for each pin. Here, the I/$\overline{O}$ cell is a cell (i.e., a unit circuit portion) which is so basically designed (or mastered) that it can be used to construct circuits requiring the largest number of the elements for the respective input and output circuits. In case the aforementioned requirements are to be satisfied by providing such I/$\overline{O}$ cells, this I/$\overline{O}$ cell is so formed that it can set the function of one pad (or pin) at any of the input, the output, or bi-directionally of the input and output so as to fabricate the IC resorting to the master slice approach. As a result, the other elements for realizing functions other than the selected one, are not used, but one I/$\overline{O}$ cell performs nothing but one selected function. Moreover, in the relationship in the arrangement between the conventional bonding pad and this I/$\overline{O}$ cell, according to the prior art, although the input circuit and the output circuit can naturally be simultaneously constructed using the I/$\overline{O}$ cell independently of each other, both the input and output cannot be extracted separately and independently of each other, but only either of them can be extracted from the single I/$\overline{O}$ cell. With this in mind, we, the Inventors, have investigated and revealed that the approach thus far described, i.e., the conventional master slice approach, in which the requirement for setting the functions of the pins is to be satisfied by providing one I/$\overline{O}$ cell for each one pad, has failed to increase the multiple functions and kinds without changing the basic design.

SUMMARY OF THE INVENTION

It is, therefore, a first object of the present invention to provide both an IC, which is intended to cope with the increase in the multiple functions and kinds of the master slice approach, by increasing the degree of freedom in the design of an IC of the master slice approach so that any of an input, an output, bidirectionally of the input and output, and independent input and output can be arbitrarily selected as the function of one I/$\overline{O}$ cell, and a method of fabricating the same.

A second object of the present invention is to make effective use of the I/$\overline{O}$ cell without any change in the same basic design of the logic IC from that of the prior art, especially in the logical IC fabricated by the master slice approach.

According to one feature of the present invention, the region which is adjacent to an I/$\overline{O}$ cell (i.e., a unit input/output circuit portion) and which is to be formed with a bonding pad is imaginarily divided into a plurality of sub-regions which are respectively formed with a plurality of separate and independent bonding pads so that they may be used to extract different functions from that I/$\overline{O}$ cell, or which are formed with one bonding pad thereby to extract only one function from that I/$\overline{O}$ cell or to provide a bidirectional input and output function.

Now, the present invention will be described in detail with reference to the accompanying drawings, in conjunction with embodiments in which the present invention is applied to a logic LSI resorting to a master slice approach, e.g., a logic IC of CMOS (i.e., Complementary Metal Oxide Semiconductor) type and having several thousands of logical gates.

BRIEF DESCRIPTION OF THE DRAWINGS

The accompanying drawings are all presented for explaining the embodiments of the present invention.

FIG. 3B is a top plan view in the case where a first-layered aluminum wiring is applied to the layout of the I/$\overline{O}$ cell shown in FIG. 3A;

DESCRIPTION OF THE PREFERRED EMBODIMENTS

FIGS. 1 to 5B show an embodiment in which the present invention is applied to a CMOS type LSI.

Figure 1:
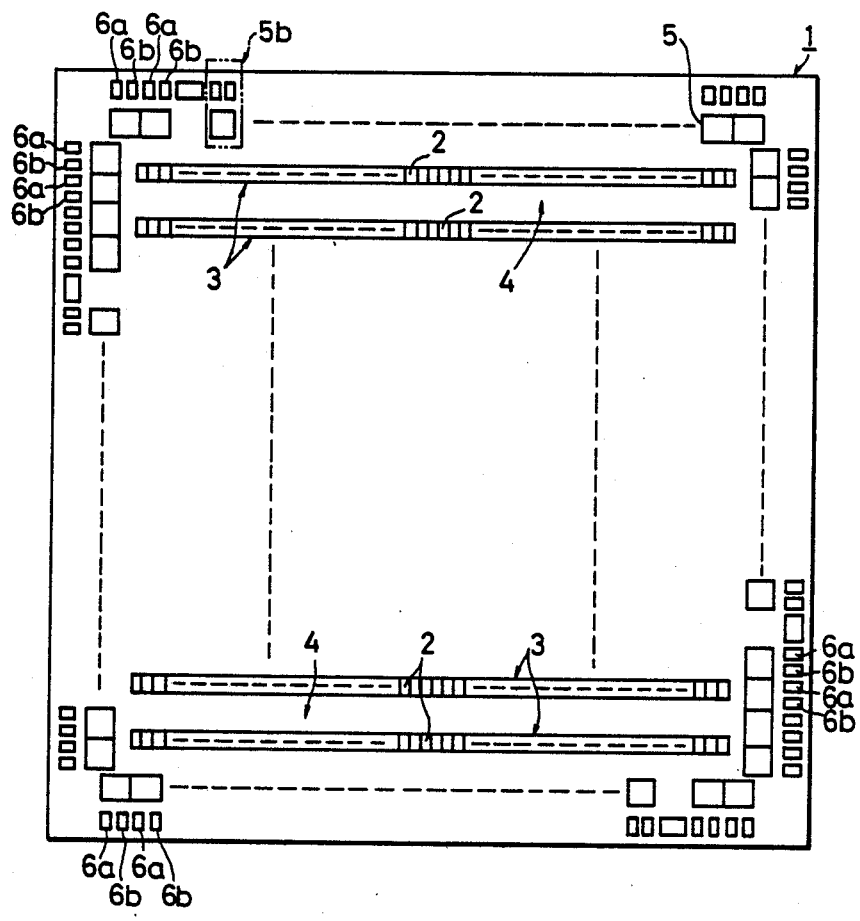
FIG. 1 is a top plan view schematically showing the layout of a CMOS type logic IC according to a first embodiment.

FIG. 1 schematically shows the layout of a semiconductor chip 1 which provides a logic IC. In this chip 1, there are transversely arranged in one hundred and several tens of rows a number of unit cells 2, which are used to construct the logic circuit, thereby to form rows of unit cells 3, and these unit cell rows 3 are longitudinally arranged in several tens of rows at a predetermined internal. Although several unit cells 2 are specifically illustrated in the drawing, the portions in the other unit cell rows 3 are absolutely similar, and the illustration of the unit cells is omitted. Although only four rows of the unit cells are shown, on the other hand, the other unit cell rows are also similar, and their illustration is likewise omitted. The interspaces between any adjacent two of the unit cell rows are used as wiring channels 4, each of which has such a width so that several tens of aluminum wires extending in the longitudinal direction can be formed on a surface of a field $SiO_2$ film forming the surface of each wiring channel. In the peripheral portion of the chip 1, there are arranged a number of I/$\overline{O}$ cells 5 for constructing input and output circuits. Each of these I/$\overline{O}$ cells is formed to have a variety of circuit functions for an input circuit, an output circuit, a clock input circuit, a bidirectional buffer circuit and so on by such an aluminum wiring as will be described hereinafter. At a position adjacent to each I/$\overline{O}$ cell, moreover, there are formed for each cell two bonding pads 6a and 6b which are arranged at a predetermined regular pitch. This provision of two bonding pads for each cell plays an important role for extracting (or selecting) the aforementioned various circuit functions.

Here, the procedure for forming such logic IC in accordance with the master slice approach will be described in the following. First of all, the circuit elements of the unit cells 2 and the I/$\overline{O}$ cells 5, i.e., MIS (i.e., Metal Insulator Semiconductor) type field effect transistors (i.e., MISFETs), resistors, polysilicon gate wires and so on are formed in accordance with the basic design (i.e., the master). This basic design is not changed but retains an identical pattern for all slices (chips. Next, after the whole surface has been covered with a phosphosilicate glass film (which will be referred to as a "PSG film") as an interlayer insulating film, this interlayer insulating film is formed with respective contact holes. After this step of forming the contact holes, various modifications conforming to desired logic functions are made so as to realize the functions desired for the specific chip. Next, a first-layered aluminum wiring (which will be referred to as "Al-I") is applied to the upper surface. This Al-I includes the wirings for constructing the logic circuits in the unit cells 2, the power source ($V_{DD}$ and $V_{SS}$) wirings (which are of all kinds and in an identical pattern) for the unit cells 2, the wirings for constructing the input/output circuits in the I/$\overline{O}$ cells 5, and the wirings extending in the longitudinal direction on the wiring channels 4 which connect the unit cells 2. Moreover, the two bonding pads 6a and 6b provided for each I/$\overline{O}$ cell 5 is made of the Al-I. Next, after coverage has been made with a second-layered interlayer insulating film (i.e., a PSG film), respective through holes are formed therein, and a second-layered aluminum wiring (which will be referred to as "Al-II") is applied. This Al-II includes the power source wirings (which are of all kinds and in an identical pattern) for the I/$\overline{O}$ cells 5, the wirings extending on the unit cells 2 in a direction to intersect the wiring channels 4 to connect the plural unit cells 2 so as to construct the logic circuits, and the pad layers overlaid in an identical pattern on the aforementioned Al-I so as to form an upper layer of the bonding pads 6a and 6b.

The unit cells 2 are basically designed so that each cell can be used to construct three-input CMOS type NAND gates at the maximum, and each of them is equipped therefor with three P-channel MISFETs and three N-channel MISFETs.

Figure 2A:
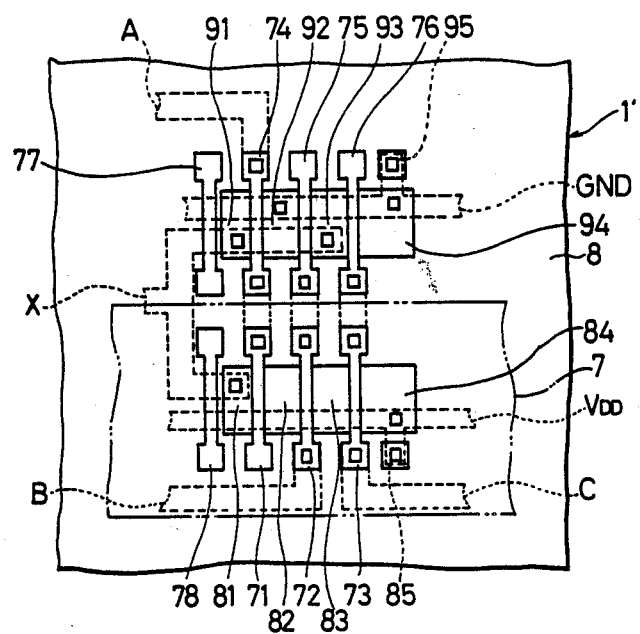
FIG. 2A is a top plan view showing the unit cell for the logic circuit.
Figure 2B:
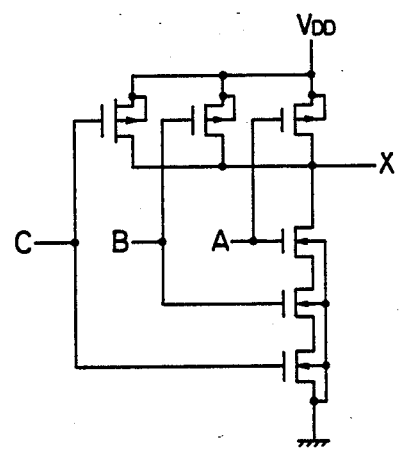
FIG. 2B is a diagram showing an equivalent circuit of the unit cell.

As one example for constructing a logic circuit by the use of these unit cells, the layout in case three input NAND gates are constructed is shown in FIG. 2A, and the circuit diagram thereof is shown in FIG. 2B. In order to effect the circuit design according to the master slice approach, there are formed six MISFETs for providing the basic design (i.e., the master). Specifically, there are formed a P-type well 7 which is formed in an N-type silicon semiconductor substrate 1', a field $SiO_2$ film 8, polysilicon layers 71 to 78, and $N^+$-type semiconductor regions 81 to 84 and $P^+$-type semiconductor regions 91 to 94 which are formed respectively in the P-type well 7 substrate 1' in a self-aligned manner by the ion-implantation or diffusion technique using the field $SiO_2$ film 8 and the polysilicon layers 71 to 76 for gate electrodes as masks thereby to provide source or drain regions. There are further formed an N-type region 95 and a P-type region 85 for biasing the N-type substrate 1' and the P-type well 7. Subsequently, the Al-I is formed on the first interlayer insulating film (although not shown) which is formed all over the surface to cover the pattern of the aforementioned basic design (i.e., the master). As a result, there are formed input wirings A, B and C, and an output wiring X for constructing the logical circuit in the unit cell 2, e.g., three-input NAND gates. Moreover, both the power source wiring $V_{DD}$ for supplying the power source ($V_{DD}$) to the unit cell 2 and a grounding wiring GND are formed of the Al-I. Although not shown, the wirings A, B, C and X are connected through the Al-II with the logic gates which are part of other unit cells, respectively. Incidentally, these interconnections can also be made by the Al-I if they can be effected only on the wiring channels 4.

The I/$\overline{O}$ cells 5 are designed such that a circuit at most requiring the number of elements for each of the input and output circuits can be constructed by one I/$\overline{O}$ cell. In the present example, in order to provide interchangeability with an LSTTL (i.e., Low power Schottky TTL), the elements for constructing a converter for mutually converting the logic level of the CMOS and the level of the LSTTL are built in the I/$\overline{O}$ cell. In the drawings to follow, however, a portion of the I/$\overline{O}$ cell is shown, but the aforementioned level converting circuit portion is omitted.

An example, in which input and output circuits are constructed independent of each other, using the single I/$\overline{O}$ cell, will be described with reference to FIGS. 3A to 5B. It has been impossible according to the prior art to construct and use independent input and output circuits by means of a single I/$\overline{O}$ cell.

Figure 3A:
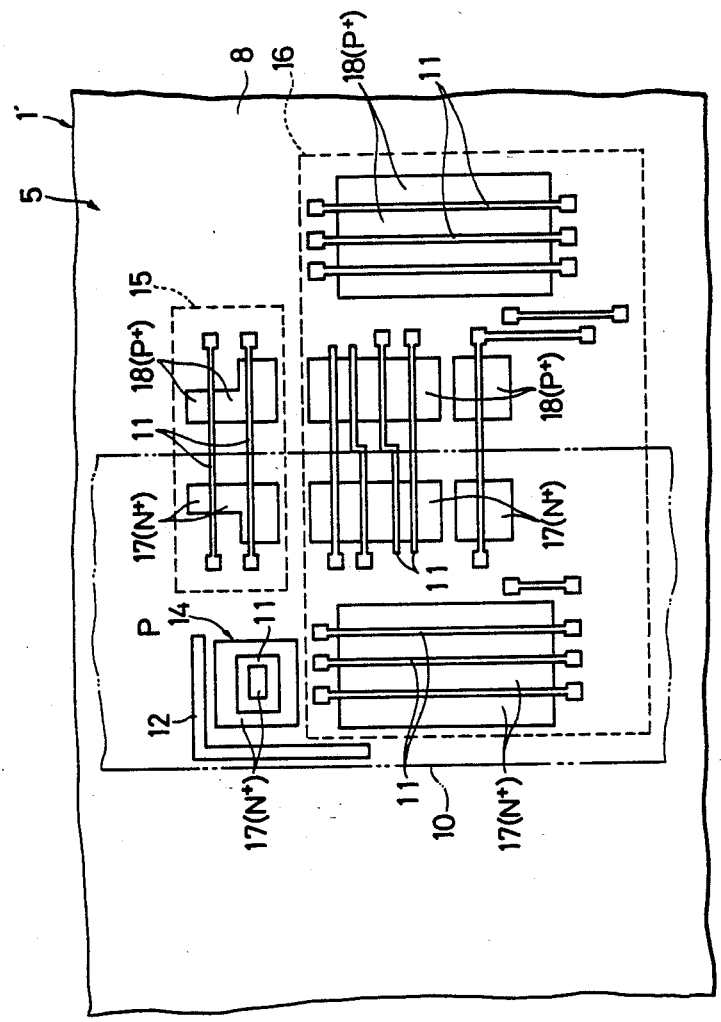
FIG. 3A is a top plan view showing an I/$\overline{O}$ cell.
Figure 3C:
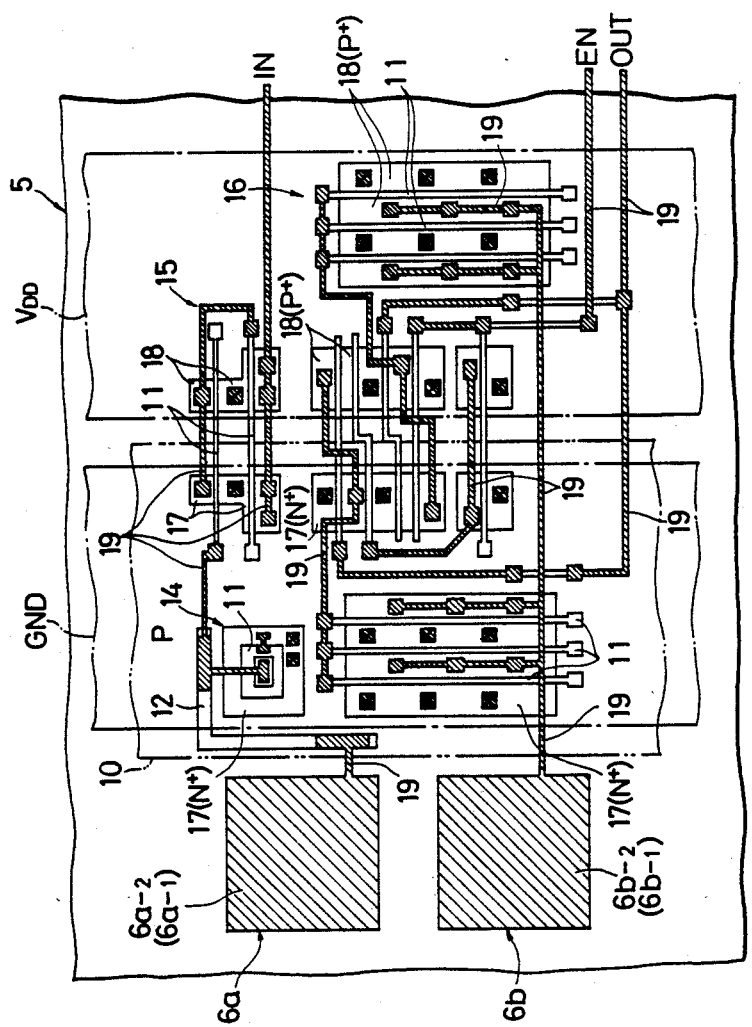
FIG. 3C is a top plan view in the case where a second-layered aluminum wiring is applied to the layout of the I/$\overline{O}$ cell shown in FIG. 3B.

The method of forming the I/$\overline{O}$ cell is illustrated in accordance with the steps in FIGS. 3A to 3C, of which FIG. 3A illustrates the layout at the step of the basic design (i.e., the master). Specifically, there are formed a P-type well 10, a field $SiO_2$ film 8, a polysilicon layer 11 acting as a gate electrode, a polysilicon layer 12 acting as an input protection resistor, and an $N^+$-type semiconductor region 17 and a $P^+$-type semiconductor region 18 which are formed in a self-aligned manner by ion-implantation or diffusion using the polysilicon layer 11 and the field $SiO_2$ film 8 as masks, so as to provide a source or drain region.

The important construction in the embodiment being described is that the bonding pads formed adjacent to the I/$\overline{O}$ cell 5 are provided in a number corresponding to or more than the number of the functions to be performed by that I/Ō cell, e.g., two bonding pads for each I/Ō cell are provided.

The major portion of the construction including those bonding pads will be described in the following with reference to FIGS. 3B, 3C and 4.

After the cell construction conforming to the basic design has been formed, as illustrated in FIG. 3A, respective aluminum wirings 19 are then applied by the Al-I, as illustrated in FIG. 3B, so an input protection circuit composed of the polysilicon resistor 12 and a diode 14, an input circuit composed of a CMOS inverter circuit 15, and a three-state output circuit 16 may have independent functions. The regions hatched in the drawing indicate those aluminum wirings 19, the interconnection with the underlying diffusion region or polysilicon layer being effected at either the wider wiring portion or at such a place of the portion indicated at "X" as is made wide of the dog bone type. Simultaneously with the wiring step of that Al-I, there are respectively formed bonding pads 6a-1 and 6b-1, of the Al-I, for extracting the input and output from the I/Ō cell 5 independently of each other. Those pads 6a-1 and 6b-1 have their wirings designed so that they are connected with the input protection resistor 12 and the output circuit 16, respectively, by means of the aluminum wirings 19.

After the coverage of the second interlayer insulating film, an Al-II is then formed, as illustrated in FIG. 3C. This Al-II forms the aluminum wiring interconnecting the unit cell 2 and the I/Ō cell 5 described above, the power source wiring $V_{DD}$ for supplying the power source ($V_{DD}$) to the I/Ō cell 5, and the grounding wiring GND, and further aluminum pads 6a-2 and 2b-2 just above and in the same shape as the aforementioned pads 6a-1 and 6b-1. The portions indicated at "X" in the drawing designate the portions in which the Al-II is interconnected with the Al-I through through-holes formed on the Al-I contacting with the diffusion region in FIG. 3B. In this case, the contacting portions between the Al-I and the diffusion region or the polysilicon layer are not illustrated.

Thus, there are formed adjacent to the I/Ō cell 5 in an isolated manner from each other the input bonding pad 6a, which is composed of the aluminum pad 6a-1 of the Al-I and the aluminum pad 6a-2 of the Al-II; and the output bonding pad 6b, which is composed of the aluminum pad 6b-1 of the Al-I and the aluminum pad 6b-2 of the Al-II.

Figure 4:
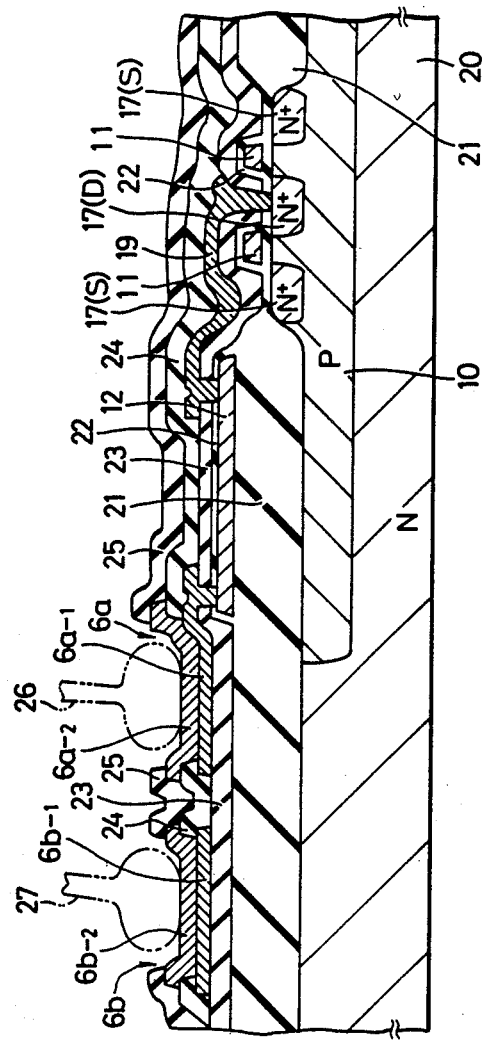
FIG. 4 is a sectional view showing an essential portion of FIG. 3C.

This state is clearly illustrated in FIG. 4. FIG. 4 is a sectional view showing a portion including the output pad 6b, the input pad 6a, the wiring 19, the input protection resistor 12, the wiring 19 and the gate protecting circuit 14. In the drawing, reference numeral 20 indicates an N-type silicon substrate; numeral 21 a field $SiO_2$ film; numeral 22 the $SiO_2$ film on the surface of the polysilicon layer; numeral 23 a first PSG film; numeral 24 a second PSG film; and numeral 25 a third PSG film. Incidentally, the construction per se of FIG. 4 can be fabricated by well-known techniques such as the usual thermal oxidation, ion-implantation, photoetching, chemical vapor growth and vacuum evaporation techniques, and the description thus far made has not touched the detail of the fabricating conditions.

Figure 5A:
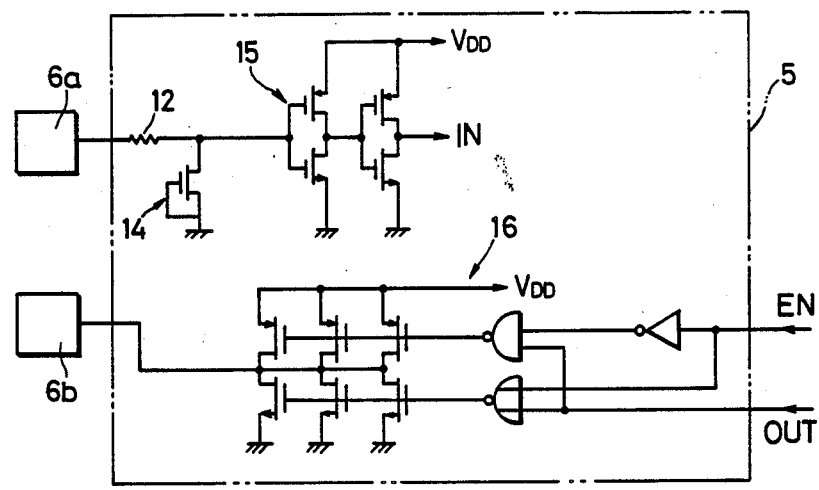
FIG. 5A is a diagram showing an equivalent circuit of the I/$\overline{O}$ cell of FIG. 3C.
Figure 5B:
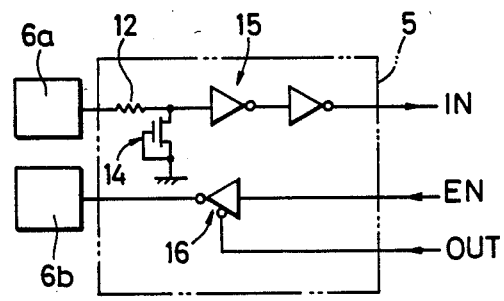
FIG. 5B is a circuit diagram showing the equivalent circuit in circuit symbols.

The circuit of FIG. 3C is equivalently shown in FIGS. 5A and 5B, of which FIG. 5A is an equivalent circuit diagram whereas FIG. 5B is a circuit diagram shown by means of circuit symbols.

As shown in FIG. 5A, the input circuit is constructed of the input protection circuit which is composed of the input protection resistor 12 and the diode 14, and the two-stage CMOS inverter 15. Moreover, the signal fed from the pad 6a is further fed therethrough to IN and is connected through the aforementioned LSTTL-CMOS level converter with the logic circuit composed of the unit cell 2. On the other hand, the output circuit is composed of the CMOS inverter, the NAND gate, the NOR gate and three-state output buffer composed of six MOSs. Moreover, two signals EN and OUT, which are fed from the logic circuit composed of the unit cell 2, are fed through the CMOS-LSTTL level converter to the aforementioned CMOS inverter and NOR gate, respectively. The signal, which is derived from those two signals EN and OUT, drives the three-state output buffer, the output of which is fed from the pad 6b. FIG. 5B is a block diagram showing the aforementioned circuit by means of symbols.

Figure 6A:
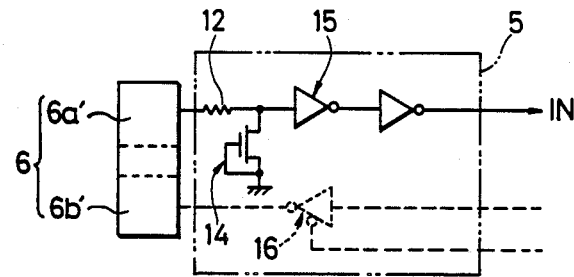
FIGS. 6A, 6B and 6C are circuit diagrams showing I/$\overline{O}$ cells according to second, third and fourth embodiments, respectively.
Figure 6B:
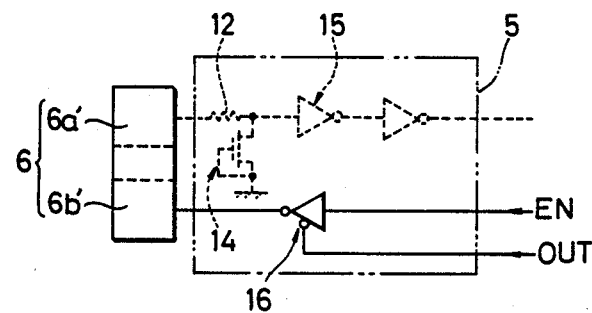

FIGS. 6A, 6B and 8B illustrate the I/Ō cell by a method similar to that of FIG. 5B.

In the case of the construction shown in FIGS. 3C and 4, the input circuit and output circuit of the I/Ō cell 5 can be separately connected with external leads by compression-bonding bonding wires 26 and 27 from the external leads to the respective bonding pads 6a and 6b. In other words, both the input and output functions belonging to the I/Ō cell can be simultaneously selected. This is because the two bonding pads 6a and 6b are provided in connection with the single I/Ō cell and are used separately of each other. This cannot be conceived in the prior art system having one I/Ō cell and one pad.

Figure 6C:
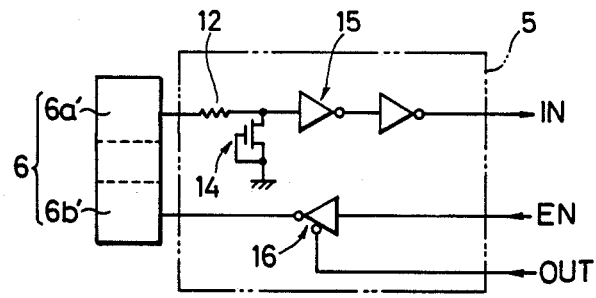

FIGS. 6A, 6B and 6C show second, third and fourth embodiments of the present invention, respectively. These second, third and fourth embodiments are those in which at least one of the couples 5b of the I/Ō cells 5, indicated at single-dotted lines in the general layout of the chip shown in FIG. 1, and the two corresponding pads 6a and 6b are replaced by the couples of the I/Ō cells and the pads shown in FIGS. 6A, 6B and 6C, respectively. The basic design (i.e., the master) of the I/Ō cells, and the unit cells of those embodiments, is similar to that of the first embodiment, and its explanation is omitted here. Moreover, it goes without saying that those second to fourth embodiments are prepared by steps similar to those having been described in connection with the first embodiment.

Those embodiments are the embodiment (as shown in FIG. 6A) in which only the input circuit portion of the I/Ō cell 5 is coupled with the bonding pad, the embodiment (as shown in FIG. 6B) in which only the output circuit portion is coupled with the bonding pad, and the embodiment (as shown in FIG. 6C) in which both the input and output circuit portions are coupled with the bonding pad as the bidirectional input and output. The circuit portions for the second and third embodiments left uncoupled are indicated by broken lines. Such circuit portions, left uncoupled, are provided by not forming the Al-I layer at the wiring positions corresponding to the portions indicated at the broken lines in FIGS. 6A and 6B.

The different between these second through fourth embodiments, on the one hand, and the first embodiment, on the other, resides in that the bonding pad (for the second through fourth embodiments) for the single I/Ō is made as if the two pads having been described in the foregoing first embodiment were short-circuited.

By the broken lines appearing in the bonding pads 6 of FIGS. 6A to 6C, specifically, the pads 6 are so shaped that regions 6a' and 6b' correspond to pads which are imaginarily divided into two. The positions and sizes of these regions 6a' and 6b' thus divided are respectively identical to those of the pads 6a and 6b of the foregoing first embodiment.

Figure 7:
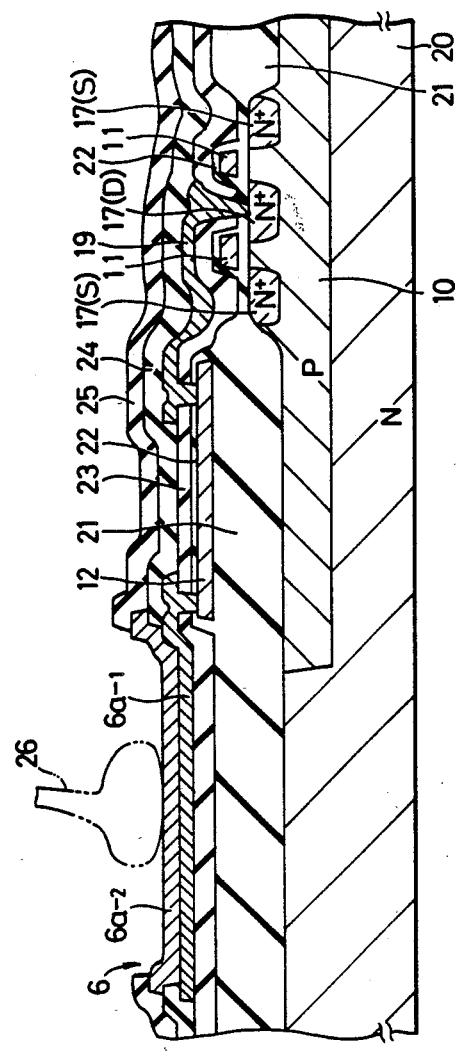
FIG. 7 is a sectional view showing an essential portion of FIG. 6A.

The construction of these pads 6 is shown in FIG. 7. FIG. 7 illustrates the sectional construction of the embodiment of FIG. 6A and is a sectional view corresponding to FIG. 4. The pad 6 has such a laminated construction as is composed of the Al-I and the Al-II. Moreover, the Al-I is so designed that it is connected during its forming step with the input of the I/O cell 5. As a result, the pad 6 thus obtained is connected with the input circuit of the I/O cell 5. As is apparent from a comparison with FIG. 4, the pad 6 is formed all over the regions 6a' and 6b' which in turn correspond to the pads 6a and 6b. Moreover, the bonding wire 26 is compression-bonded to the pad 6 to connect the input circuit of the I/O cell and the external leads. The sectional constructions of the embodiments of FIGS. 6B and 6C are omitted from being explained because they can be easily judged from FIG. 7. If the pad 6 is made wider, as in these embodiments, the bonding process can be facilitated to have its reliability improved.

In the embodiments of FIGS. 6A and 6B, incidentally, it is possible to form only one pad 6a or 6b at the positions of the two regions 6a' and 6b', corresponding to the aforementioned pads, and to interconnect that pad 6a or 6b and the input or output circuit.

The embodiments thus far described can be obtained as a modification of the first embodiment, in case there arises a condition under which the two pads need not be arranged for each I/O cell in accordance with the numbers of the pins and the bonding wires and with the circuit aimed at. Moreover, the kind of the IC obtainable by the same basic design (i.e., the master) is widened as compared with prior art.

In the case of this embodiment, the ratio between the portion formed with two pads for one I/O cell and the portion formed with one pad can be variously changed according to several conditions including the aforementioned number of pins. In this case, incidentally, if two pads are provided for the I/O cell at the center portion of the chip whereas one pad is provided for the I/O cell at the end portion while considering the bonding condition, i.e., that the bonding wire is tensed perpendicularly to the chip side at the aforementioned center portion but is tensed more obliquely at the chip side, as it approaches the more to the end portion of the side, so that the bonding process becomes the more difficult, the workability and reliability of the bonding process can be improved.

Although the present invention has been exemplified hereinbefore, the foregoing respective embodiments can be further modified in accordance with the technical concept of the present invention.

As a modification of the foregoing second to fourth embodiments, for example, even if the Al-I is provided separately as the pads 6a and 6b of the foregoing first embodiment, those pads 6a and 6b can be short-circuited to provide the pad 6 by means of the second Al-II under such conditions, it is possible to extract only the input, the output or the bidirectional input and output. In this modification, the pattern of the underlying Al-I need not be changed in the least, relative to that for the first embodiment, so that the mask for forming the underlying pad can be produced more easily. The short-circuited structure thus prepared may be provided at the cell of a portion of the whole I/O cell, but its number may be suitably changed in accordance with the several conditions such as the aforementioned pin number.

Moreover, all the respective pads need not be formed into an identical rectangular shape but, may be arranged more generally, in shape of a parallelogram in conformity with the compression-bonding direction of the bonding wire, for example, as they approach closer to both ends of the pad rows.

In the first embodiment, still moreover, the number of the pads to be arranged for each I/O cell may be equal to or less than the number of the output functions performed by that I/O cell, e.g., two or more. In an alternative, more pads, e.g., three pads, than the number of the input and output functions can be provided. In this case, the degree of freedom in selecting the pads is further augmented in accordance with the aforementioned number of the input and output functions.

Incidentally, the present invention can be applied to other than the CMOS type logic IC.

As is now apparent from the foregoing description, the semiconductor integrated circuit device according to the present invention can enjoy the following prominent advantages, as will be summarized in the following:

(1) Especially in the IC design resorting to the master slice approach, the bonding pads can be arbitrarily selected in accordance with the number (i.e., the number of the functions performed by the I/O cell) of the input and output signals to be extracted from the I/O cells, without any change in the basic design (i.e., the master), so that the degree of freedom in the IC design can be augmented. Since the bonding pads can be constructed to satisfy all the respective functions of the I/O cell, the bonding pads can also be arbitrarily selected in accordance with the master slice approach.

(2) As a result, restriction of the number of signals to be extracted can be remarkably reduced without any change in the basic design, so that the number of pins can be increased far more (e.g., twice as many as the pins) than in the prior art.

(3) Since the two independent functions of the input and output circuits can be imparted to a single I/O cell, the efficiency of using the I/O cell can be made excellent.

What is claimed is:

1. A semiconductor integrated circuit device comprising:
   a semiconductor substrate;
   a plurality of I/O cells formed on said semiconductor substrate, each of said I/O cells including predetermined circuit elements capable of being interconnected to provide at least one of the circuit functions of an input circuit, an output circuit and an input/output circuit;
   a plurality of bonding pads formed on said semiconductor substrate corresponding to respective I/O cells, with each I/O cell having at least two independent bonding pads in correspondence therewith, the number of bonding pads exceeding the number of I/O cells, said at least two bonding pads being adjacent to each other; and
   a wiring pattern for providing each of said I/O cells with at least two selected circuits of said input, output and input/output circuits, said wiring pattern including an interconnection for electrically connecting each of said I/O cells with at least two of said corresponding bonding pads to extract said two selected circuits from each I/O cell.

2. A semiconductor integrated circuit device according to claim 1, wherein one of the two bonding pads, which are provided for each of said I/O cells, is adapted to supply the input circuit of the I/O cell with a signal whereas the other of said bonding pads is adapted to derive a signal from the output circuit of the I/O cell.

3. A semiconductor integrated circuit device according to claim 1 or 2, wherein each of said bonding pads is composed of a lower conductor film and an upper conductor film overlaid on and in contact with the former.

4. A method of fabricating a semiconductor integrated circuit device comprising:

forming a plurality of I/O cells on a semiconductor substrate, each including predetermined circuit elements capable of being interconnected to provide at least one of the circuit functions of an input circuit, an output circuit and an input/output circuit;

forming at least two bonding pads on said semiconductor substrate corresponding to a respective I/O cell, the at least two bonding pads being adjacent to each other, the number of bonding pads formed on the semiconductor substrate exceeding the number of I/O cells; and forming a wiring pattern, for providing said respective I/O cell with at least two selected circuits providing said input, output and input/output circuits, said wiring pattern including an interconnection for electrically connecting said I/O cells with the at least two corresponding bonding pads to extract said two selected circuits from said I/O cell.

5. A fabricating method according to claim 4, wherein said at least two bonding pads are formed adjacent to said respective I/O cell.

6. A semiconductor integrated circuit device according to claim 1, wherein said at least two bonding pads in correspondence with said respective I/O cells are positioned adjacent to said respective I/O cells.

7. A semiconductor integrated circuit device comprising:

a semiconductor substrate;

a plurality of I/O cells formed on said semiconductor substrate, each of said I/O cells including predetermined circuit elements capable of being interconnected to provide at least one of the circuit functions of an input circuit, an output circuit and an input/output circuit;

a plurality of bonding pads formed on said semiconductor substrate corresponding to I/O cells, each of the bonding pads corresponding to a respective I/O cell being located adjacent said respective I/O cell, at least one of the I/O cells having at least two bonding pads corresponding thereto, the number of bonding pads exceeding the number of I/O cells; and a wiring pattern for providing each of said I/O cells with selected circuits providing said at least one of the circuit functions, said wiring pattern including an interconnection for electrically connecting each of said I/O cells with said corresponding bonding pads to extract said selected circuits providing said at least one of the circuit functions from each I/O cell.

8. A semiconductor integrated circuit device according to claim 7, wherein a single bonding pad corresponds to a respective I/O cell, said single bonding pad being adjacent said respective I/O cell.

9. A method of fabricating a semiconductor integrated circuit device formed with a plurality of I/O cells each including a predetermined number of circuit elements capable of being interconnected to provide at least one predetermined circuit function of an input circuit, an output circuit and an input/output circuit, comprising:

forming the circuit elements of each of said I/O cells in a predetermined element pattern on a semiconductor substrate;

interconnecting at least some of the circuit elements of each of said I/O cells in a pattern so as to provide said predetermined circuit function; and forming bonding pads for said I/O cells, with at least one bonding pad corresponding to a respective I/O cells, at least one of the I/O cells having at least two bonding pads corresponding thereto, the total number of bonding pads exceeding the number of I/O cells, and with said at least one bonding pad corresponding to said respective I/O cell being adjacent said respective I/O cell.

10. A fabricating method according to claim 9, wherein said interconnecting at least some of the circuit elements and said forming bonding pads are performed simultaneously.

11. A method of forming semiconductor integrated circuit devices using a master slice, said master slice having a plurality of I/O cells on a semiconductor substrate, each of said I/O cells including a predetermined number of circuit elements capable of being interconnected to provide at least one predetermined circuit function of an input circuit, an output circuit and an input/output circuit, including:

forming a plurality of bonding pads for said plurality of I/O cells, with at least one bonding pad being formed to correspond to each I/O cell, at least one of said plurality of I/O cells having at least two bonding pads corresponding thereto, whereby the total number of bonding pads exceeds the number of I/O cells, the at least one bonding pad corresponding to a respective I/O cell being formed adjacent to said respective I/O cell, each of the at least one bonding pads being independent of each other.

12. A fabricating method according to claim 11, further including interconnecting at least some of the circuit elements of each of said I/O cells in a pattern so as to provide said at least one predetermined circuit function.

13. A fabricating method according to claim 12, wherein said plurality of I/O cells are located on a first area of the semiconductor substrate, the substrate also including thereon a plurality of rows of unit cells, for providing a logic circuit, said plurality of rows of unit cells being formed on a second area of said substrate different from the first area.

14. A fabricating method according to claim 13, wherein said first area extends around the periphery of the second area.

15. A fabricating method according to claim 11, wherein at least two bonding pads are formed to correspond to each I/O cell, said at least two bonding pads being adjacent each other.

16. A fabricating method according to claim 15, wherein at least one of said I/O cells is provided with two circuits to provide said at least one predetermined circuit function, the method further including connecting each of said at least one of the I/O cells to two bonding pads formed to correspond thereto.

17. A fabricating method according to claim 11, wherein said bonding pads are formed by forming a lower conductor film on the semiconductor substrate and an upper conductor film overlaid on and in contact with the lower conductor film.

18. A fabricating method according to claim 8, 9 or 12, further including interconnecting bonding pads to the corresponding I/O cells.

19. A fabricating method according to claim 18, wherein said interconnecting bonding pads to the corresponding I/O cells is performed simultaneously with said interconnecting at least some of the circuit elements of each of said I/O cells.

20. A fabricating method according to claim 18, wherein said forming bonding pads, said interconnecting bonding pads to the corresponding I/O cells, and said interconnecting at least some of the circuit elements of each of said I/O cells are performed simultaneously.

21. Product formed by the process of claim 11.
22. Product formed by the process of claim 13.
23. Product formed by the process of claim 15.
24. Product formed by the process of claim 18.

* * * * *